(12) United States Patent
Aisenbrey (10) Patent No.: US 7,425,885 B2
(45) Date of Patent: Sep. 16, 2008

(54) LOW COST ELECTRICAL FUSES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 320 days.

(21) Appl. No.: 11/121,362

(22) Filed: May 4, 2005

(65) Prior Publication Data
US 2005/0206491 A1    Sep. 22, 2005

Related U.S. Application Data

(63) Continuation-in-part of application No. 10/877,092, filed on Jun. 25, 2004, now abandoned, which is a continuation of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/568,631, filed on May 6, 2004, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01H 85/06*      (2006.01)
*H01H 85/143*     (2006.01)

(52) U.S. Cl. ................ 337/290; 337/187; 337/159; 337/296

(58) Field of Classification Search ............... 337/187, 337/159, 290, 296
See application file for complete search history.

(56) References Cited

U.S. PATENT DOCUMENTS

| 4,067,103 A | 1/1978 | Ciesmier ................ 29/623 |
| 4,224,592 A | 9/1980 | Urani et al. ............. 337/198 |
| 4,481,498 A * | 11/1984 | McTavish et al. ........ 338/20 |

(Continued)

FOREIGN PATENT DOCUMENTS

GB          2 377449 A       1/2003

OTHER PUBLICATIONS

Co-pending U.S. Appl. No. 11/121,361, filed May 4, 2005, "Low Cost Electrical Fuses Manufactured From Conductive Loaded Resin-Based Materials", assigned to the same assignee.

*Primary Examiner*—Anatoly Vortman
(74) *Attorney, Agent, or Firm*—Douglas Schnabel (57) ABSTRACT

Electrical fuse devices are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, aluminum fiber, or the like.

23 Claims, 4 Drawing Sheets

U.S. PATENT DOCUMENTS

| | | | | |
|---|---|---|---|---|
| 4,757,423 | A * | 7/1988 | Franklin | 361/275.4 |
| 4,787,135 | A * | 11/1988 | Nagahori | 29/612 |
| 5,171,774 | A * | 12/1992 | Ueno et al. | 524/495 |
| 5,614,881 | A * | 3/1997 | Duggal et al. | 338/22 R |
| 5,940,958 | A * | 8/1999 | Shaw et al. | 29/612 |
| 5,963,121 | A * | 10/1999 | Stygar et al. | 337/155 |
| 6,128,168 | A * | 10/2000 | Arnold et al. | 361/13 |
| 6,479,575 | B1 * | 11/2002 | Chu et al. | 524/495 |
| 6,642,834 | B1 | 11/2003 | Oh et al. | 337/282 |
| 2002/0137831 | A1 * | 9/2002 | Horibe et al. | 524/439 |
| 2002/0161090 | A1 * | 10/2002 | Blok | 524/425 |
| 2003/0090855 | A1 * | 5/2003 | Chu et al. | 361/305 |
| 2004/0041683 | A1 * | 3/2004 | Tosaka et al. | 338/22 R |
| 2004/0099846 | A1 * | 5/2004 | Lee et al. | 252/500 |

\* cited by examiner

LOW COST ELECTRICAL FUSES MANUFACTURED FROM CONDUCTIVE LOADED RESIN-BASED MATERIALS

RELATED PATENT APPLICATIONS

This Patent Application is related to U.S. patent application Ser. No. 11/121,361 filed on May 4, 2007, which is herein incorporated by reference in its entirety.

This Patent Application claims priority to the U.S. Provisional Patent Application No. 60/568,631, filed on May 6, 2004, which is herein incorporated by reference in its entirety.

This Patent Application is a Continuation-in-Part of U.S. patent application Ser. No. 10/877,092, filed on Jun. 25, 2004 now abandoned, which is a Continuation of U.S. patent application Ser. No. 10/309,429, filed on Dec. 4, 2002, now issued as U.S. Pat. No. 6,870,516, also incorporated by reference in its entirety, which is a Continuation-in-Part application of U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001, all of which are incorporated by reference in their entirety.

BACKGROUND OF THE INVENTION (1) Field of the Invention

This invention relates to electrical fuses and, more particularly, to electrical fuses molded of conductive loaded resin-based materials comprising micron conductive powders, micron conductive fibers, or a combination thereof, substantially homogenized within a base resin when molded. This manufacturing process yields a conductive part or material usable within the EMF or electronic spectrum(s).

(2) Description of the Prior Art

Electrical fuses are used in many electrical and electronic systems. Fuses are used to protect system components, including power sources, from excessive electrical current due to short circuiting. Electrical fuses improve system safety by preventing electrical fires. Fuses provide a very low resistance path for electrical current flow during normal operation. As such, electrical fuses are placed in series with the electrical load such that all of the current flowing from the power source and through the electrical load will also flow through the fuse. If an excessive amount of current begins to flow through the fuse, as in the case of an electrical short in the load or in the circuit feeding the load, then material in the fuse will rapidly heat. The fuse link is designed such that it will overheat and blow open when the current exceeds the specified amount. Typical fuses are constructed with fusible links comprising a metal having a relatively low melting point. It is a primary objective of the present invention to provide a new type of electrical fuse device having a unique combination of properties.

Several prior art inventions relate to electrical fuses. U.S. Pat. No. 6,642,834 B1 to Oh et al teaches a miniature plug-in fuse assembly for automotive applications and a method for manufacture. The fuse comprises a metal fusible link between two metal terminals. A plastic insulating casing covers the fusible link and terminals. U.S. Pat. No. 4,067,103 to Ciesmier teaches a miniature plug-in fuse assembly for automotive applications and a method for manufacture. The fuse comprises a metal fusible link between two metal terminals. A plastic insulating casing covers the fusible link and terminals. U.S. Pat. No. 4,224,592 to Urani et al teaches a miniature plug-in fuse assembly for automotive applications and a method for manufacture. The fuse comprises a metal fusible link between two metal terminals. A plastic insulating casing covers the fusible link and terminals.

SUMMARY OF THE INVENTION

A principal object of the present invention is to provide an effective electrical fuse device.

A further object of the present invention is to provide a method to form an electrical fuse device.

A further object of the present invention is to provide an electrical fuse device molded of conductive loaded resin-based materials.

A yet further object of the present invention is to provide an electrical fuse device molded of conductive loaded resin-based material where the electrical or thermal characteristics can be altered or the visual characteristics can be altered by forming a metal layer over the conductive loaded resin-based material.

A yet further object of the present invention is to provide a method to form an electrical fuse device that is simple and low cost.

In accordance with the objects of this invention, an electrical fuse device is achieved. The device comprises a fusible link comprising a conductive loaded, resin-based material comprising conductive materials in a base resin host. A first conductive terminal is connected to a first end of the fusible link. A second conductive terminal is connected to a second end of the fusible link.

Also in accordance with the objects of this invention, an electrical fuse device is achieved. The device comprises a fusible link, a first conductive terminal connected to a first end of the fusible link, and a second conductive terminal connected to a second end of the fusible link. The fusible link and the conductive terminals comprise a conductive loaded, resin-based material comprising conductive materials in a base resin host. The percent by weight of the conductive materials is between 20% and 50% of the total weight of said conductive loaded resin-based material.

Also in accordance with the objects of this invention, an electrical fuse device is achieved. The device comprises a fusible link, a first conductive terminal connected to a first end of the fusible link, and a second conductive terminal connected to a second end of the fusible link. The fusible link and the conductive terminals comprise a conductive loaded, resin-based material comprising micron conductive fiber in a base resin host. The percent by weight of the conductive fiber is between 20% and 50% of the total weight of the conductive loaded resin-based material.

Also in accordance with the objects of this invention, a method to form an electrical fuse device is achieved. The method comprises providing a conductive loaded, resin-based material comprising conductive materials in a resin-based host. First and second conductive terminals are formed. The conductive loaded, resin-based material is molded into a fusible link. The first conductive terminal is attached to a first end of the fusible link. The second conductive terminal is attached to a second end of the fusible link.

Also in accordance with the objects of this invention, a method to form an electrical fuse device is achieved. The method comprises providing a conductive loaded, resin-based material comprising conductive materials in a resin-based host. The conductive loaded, resin-based material is molded into a fusible link, a first conductive terminal, and a second conductive terminal. The first conductive terminal is attached to a first end of the fusible link and the second conductive terminal is attached to a second end of the fusible link.

Also in accordance with the objects of this invention, a method to form an electrical fuse device is achieved. The method comprises providing a conductive loaded, resin-based material comprising conductive materials in a resin-based host. The percent by weight of the conductive loading is between 20% and 50% of the total weight of the conductive loaded resin-based material. The conductive loaded, resin-based material is molded into a fusible link, a first conductive terminal, and a second conductive terminal. The first conductive terminal is attached to a first end of the fusible link. The second conductive terminal is attached to a second end of the fusible link.

BRIEF DESCRIPTION OF THE DRAWINGS

In the accompanying drawings forming a material part of this description, there is shown.

DESCRIPTION OF THE PREFERRED EMBODIMENTS

This invention relates to electrical fuses molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of electrical fuses fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the electrical fuse devices are substantially homogenized together using molding techniques and or methods such as injection molding, over-molding, insert molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

In the conductive loaded resin-based material, electrons travel from point to point when under stress, following the path of least resistance. Most resin-based materials are insulators and represent a high resistance to electron passage. The doping of the conductive loading into the resin-based material alters the inherent resistance of the polymers. At a threshold concentration of conductive loading, the resistance through the combined mass is lowered enough to allow electron movement. Speed of electron movement depends on conductive loading concentration, that is, the separation between the conductive loading particles. Increasing conductive loading content reduces interparticle separation distance, and, at a critical distance known as the percolation point, resistance decreases dramatically and electrons move rapidly.

Resistivity is a material property that depends on the atomic bonding and on the microstructure of the material. The atomic microstructure material properties within the conductive loaded resin-based material are altered when molded into a structure. A substantially homogenized conductive microstructure of delocalized valance electrons is created. This microstructure provides sufficient charge carriers within the molded matrix structure. As a result, a low density, low resistivity, lightweight, durable, resin based polymer microstructure material is achieved. This material exhibits conductivity comparable to that of highly conductive metals such as silver, copper or aluminum, while maintaining the superior structural characteristics found in many plastics and rubbers or other structural resin based materials.

The use of conductive loaded resin-based materials in the fabrication of electrical fuses significantly lowers the cost of materials and the design and manufacturing processes used to hold ease of close tolerances, by forming these materials into desired shapes and sizes. The electrical fuses can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. The micron conductive powders can be of carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers may be metal fiber or metal plated fiber. Further, the metal plated fiber may be formed by metal plating onto a metal fiber or metal plating onto a non-metal fiber. Exemplary micron conductive fibers include nickel plated carbon fiber, stainless steel fiber, copper fiber, silver fiber, aluminum fiber, or the like, or combinations thereof. Metal plating for fiber include copper, nickel, cobalt, silver, gold, palladium, platinum, ruthenium, and rhodium, and alloys of thereof. Non-metal fiber cores include carbon, graphite, polyester, and other synthetic materials. Superconductor metals, such as titanium, nickel, niobium, and zirconium, and alloys of titanium, nickel, niobium, and zirconium may also be used as micron conductive fibers in the present invention. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the electrical fuses. The doping composition and directionality associated with the micron conductors within the loaded base resins can affect the electrical and structural characteristics of the electrical fuses and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming electrical fuses that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in electrical fuse applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As a significant advantage of the present invention, electrical fuses constructed of the conductive loaded resin-based material can be easily interfaced to an electrical circuit or grounded. In one embodiment, the conductive loaded resin-based material is partly or completely plated with a metal layer. The metal layer forms excellent electrical conductivity with the conductive matrix. A connection of this metal layer to another circuit or to ground is then made.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

A ferromagnetic conductive loaded resin-based material may be formed of the present invention to create a magnetic or magnetizable form of the material. Ferromagnetic micron conductive fibers and/or ferromagnetic conductive powders are mixed with the base resin. Ferrite materials and/or rare earth magnetic materials are added as a conductive loading to the base resin. With the substantially homogeneous mixing of the ferromagnetic micron conductive fibers and/or micron conductive powders, the ferromagnetic conductive loaded resin-based material is able to produce an excellent low cost, low weight magnetize-able item. The magnets and magnetic devices of the present invention can be magnetized during or after the molding process. The magnetic strength of the magnets and magnetic devices can be varied by adjusting the amount of ferromagnetic micron conductive fibers and/or ferromagnetic micron conductive powders that are incorporated with the base resin. By increasing the amount of the ferromagnetic doping, the strength of the magnet or magnetic devices is increased. The substantially homogenous mixing of the conductive fiber network allows for a substantial amount of fiber to be added to the base resin without causing the structural integrity of the item to decline. The ferromagnetic conductive loaded resin-based magnets display the excellent physical properties of the base resin, including flexibility, moldability, strength, and resistance to environmental corrosion, along with excellent magnetic ability. In addition, the unique ferromagnetic conductive loaded resin-based material facilitates formation of items that exhibit excellent thermal and electrical conductivity as well as magnetism.

A high aspect ratio magnet is easily achieved through the use of ferromagnetic conductive micron fiber or through the combination of ferromagnetic micron powder with conductive micron fiber. The use of micron conductive fiber allows for molding articles with a high aspect ratio of conductive fiber to cross sectional area. If a ferromagnetic micron fiber is used, then this high aspect ratio translates into a high quality magnetic article. Alternatively, if a ferromagnetic micron powder is combined with micron conductive fiber, then the magnetic effect of the powder is effectively spread throughout the molded article via the network of conductive fiber such that an effective high aspect ratio molded magnetic article is achieved. The ferromagnetic conductive loaded resin-based material may be magnetized, after molding, by exposing the molded article to a strong magnetic field. Alternatively, a strong magnetic field may be used to magnetize the ferromagnetic conductive loaded resin-based material during the molding process.

Exemplary ferromagnetic conductive fiber materials include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive fiber materials. Exemplary non-ferromagnetic conductor fibers include stainless steel, nickel, copper, silver, aluminum, or other suitable metals or conductive fibers, alloys, plated materials, or combinations thereof. Superconductor metals, such as titanium, nickel, niobium, and zirconium, and alloys of titanium, nickel, niobium, and zirconium may also be used as micron conductive fibers in the present invention. Exemplary ferromagnetic micron powder leached onto the conductive fibers include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive powder materials.

Figure 1A:
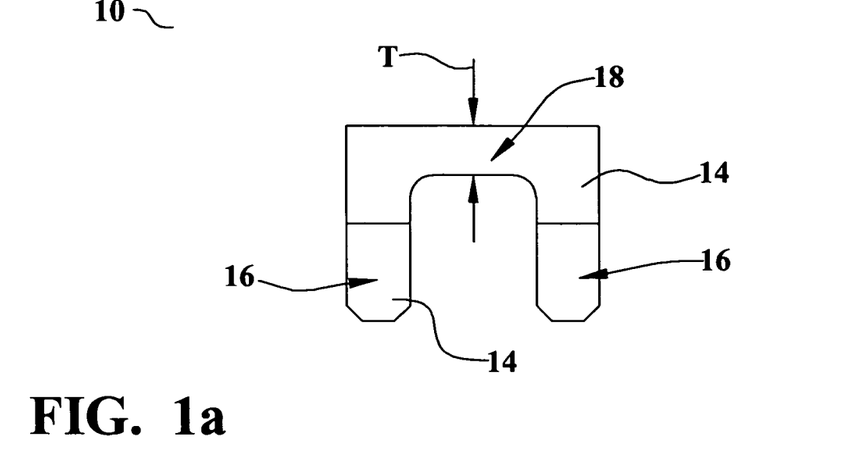
FIGS. 1a, 1b, and 1c illustrate a preferred embodiment of the present invention showing an electrical fuse comprising a conductive loaded resin-based material.
Figure 1B:
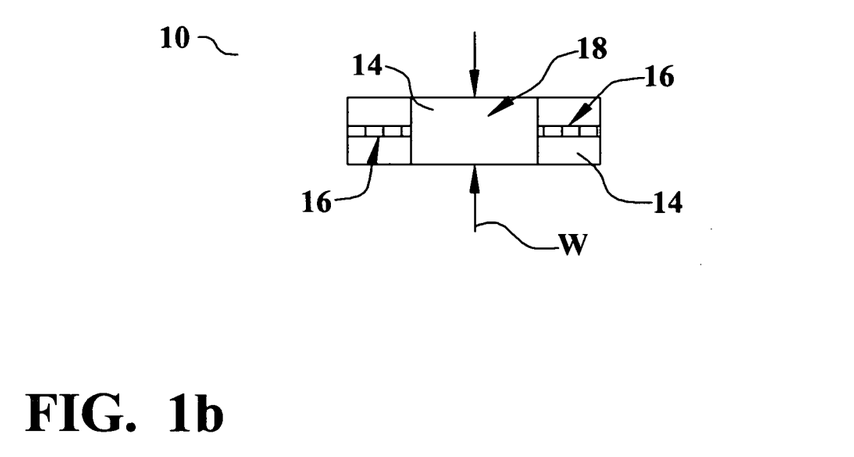
Figure 1C:
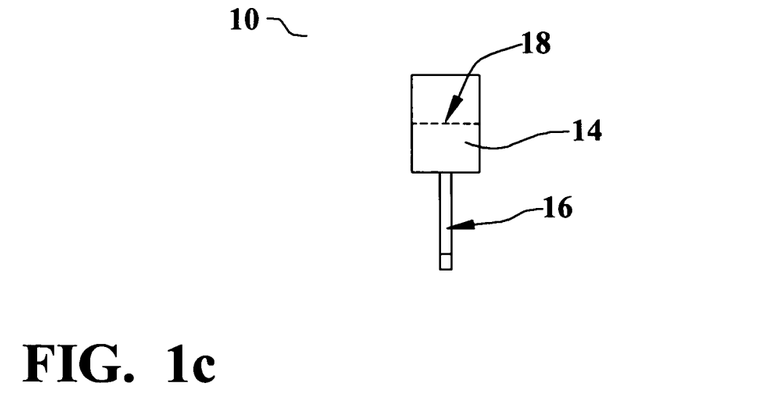

Referring now FIGS. 1a, 1b, and 1c, a preferred embodiment of the present invention is illustrated. A very low cost electrical fuse 10 comprising the conductive loaded resin-based material of the present invention is shown. Several important features of the present invention are shown and discussed below. The electrical fuse device 10 comprises two terminals 16 connected by a fusible link section 18. The terminals 16 and fusible link 18 preferably both comprise a conductive loaded resin-based material 14. The fuse performance characteristics, including the operating voltage and current range, the nominal resistance, the fusing current, and the open circuit resistance are controlled by the composition of the conductive loaded resin-based material 14. The type of the conductive materials, type of resin-based material, and the relative composition, by weight, of the conductive and resin-based materials determine the performance parameters. In addition, the design geometry, such as the width W and thickness T of the fusible link section 18, may be used to optimize the fuse performance parameters.

Typical automotive fuses comprise two metal terminals connected by a metal fusible link. The fusible link is typically insulated by a plastic housing. By comparison, the fuse 10 of the present invention comprises terminals 16 and link 18 of the conductive loaded resin-based material. In another embodiment, an insulating layer is formed overlying the fusible link 18. Preferably, this additional layer comprises a resin-based material and, more preferably, this layer comprises the same base resin as is used in the conductive loaded resin-based material of the link 18. Preferably, a single molding operation is used to form the fuse device, including the terminals 16 and the fusible link 18 entirely from the conductive loaded resin-based material 14. This manufacturing method substantially reduces the manufacturing cost in material, labor, and equipment when compared to typical, metal link fuses. In addition, the resulting fuses are non-corrosive and impervious to moisture and, therefore, well suited to difficult environmental applications such as automotive and maritime. While an automotive or recreational vehicle type of fuse is illustrated in the preferred embodiment, it should be clear to those skilled in the art any other type of electrical fuse may be formed according to the present invention. For example, fuses for typical alternating current systems, such as are used in residences and businesses, may be so formed. The fuses of the present applications may be modified for use in various electronics systems and electrical devices.

Figure 2:
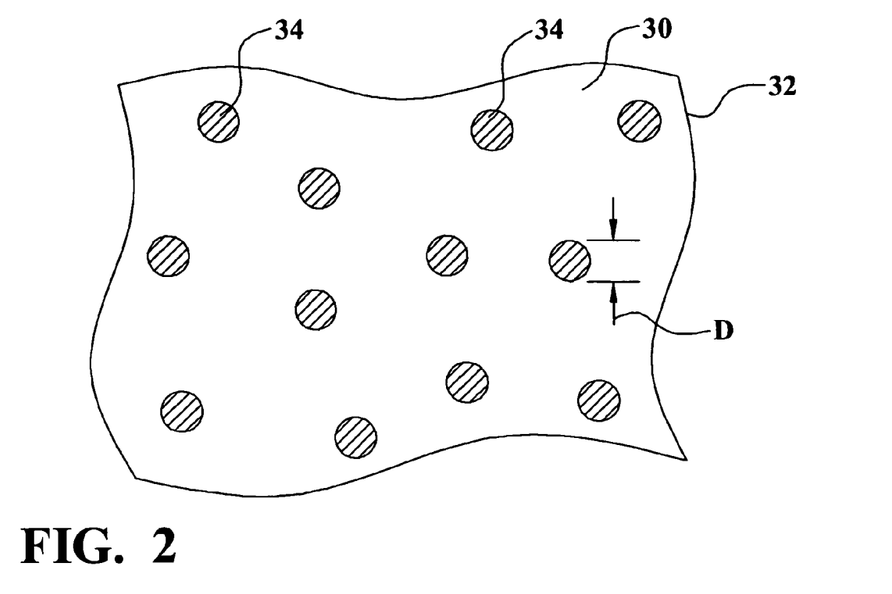
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
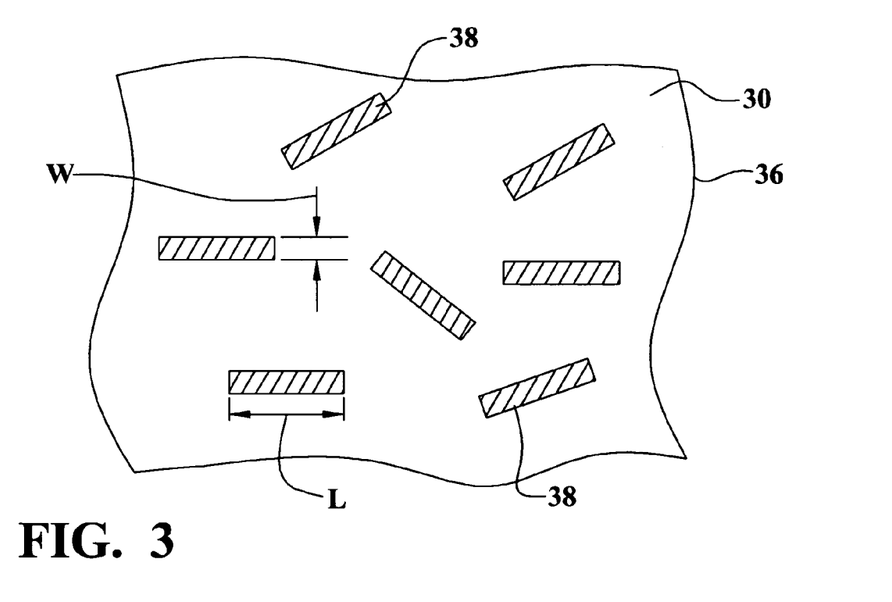
FIG. 3 illustrates a second preferred embodiment of a conductive loaded resin-based material wherein the conductive materials comprise micron conductive fibers.
Figure 4:
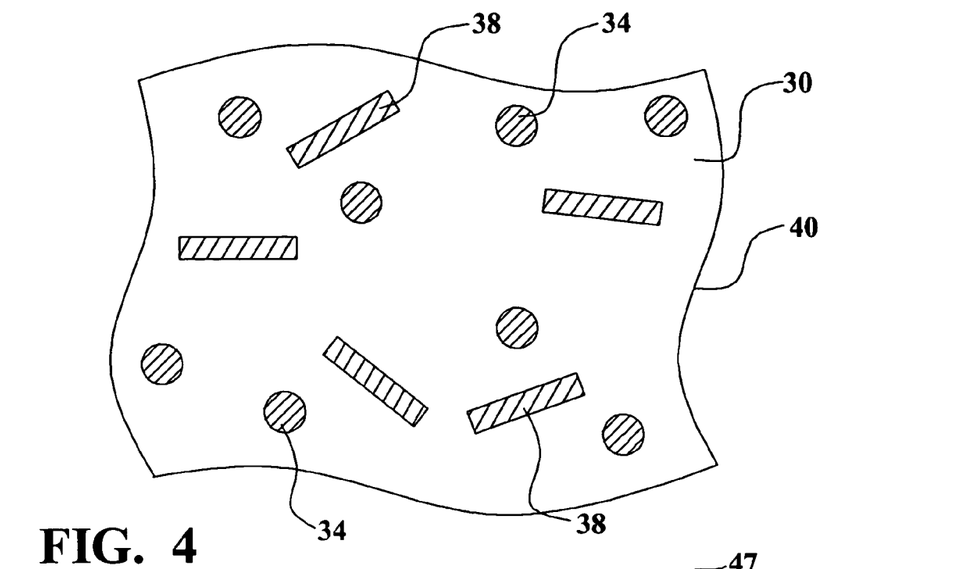
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, aluminum, or other suitable metals or conductive fibers, or combinations thereof. Superconductor metals, such as titanium, nickel, niobium, and zirconium, and alloys of titanium, nickel, niobium, and zirconium may also be used as micron conductive fibers in the present invention. These conductor particles and or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6-12 micron in diameter and lengths of 4-6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
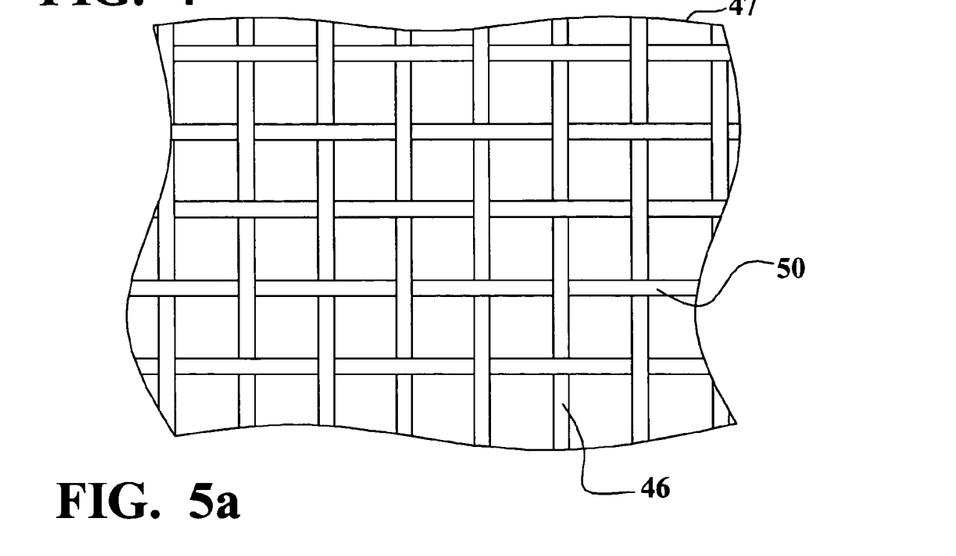
FIGS. 5a and 5b illustrate a fourth preferred embodiment wherein conductive fabric-like materials are formed from the conductive loaded resin-based material.
Figure 5B:
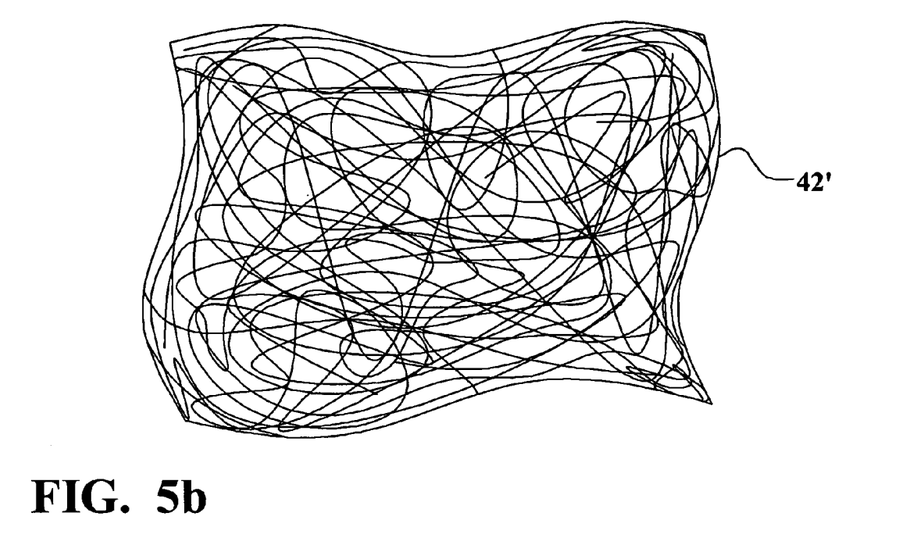

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
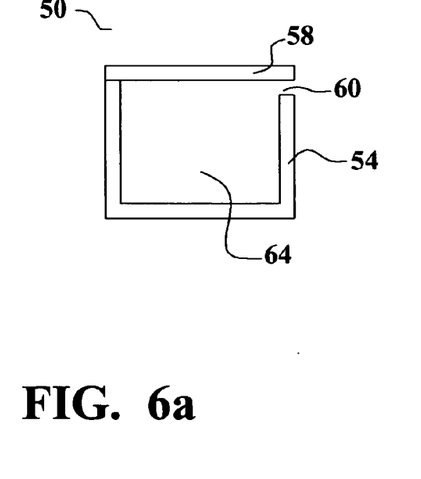
FIGS. 6a and 6b illustrate, in simplified schematic form, an injection molding apparatus and an extrusion molding apparatus that may be used to mold electrical fuse devices of a conductive loaded resin-based material.

Electrical fuses formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the electrical fuses are removed.

Figure 6B:
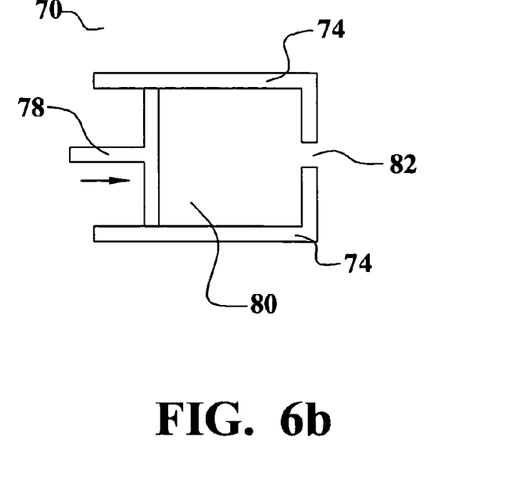

FIG. 6b shows a simplified schematic diagram of an extruder 70 for forming electrical fuses using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. An effective electrical fuse device is achieved. A method to form an electrical fuse device is also achieved. The electrical fuse device and method of manufacture results in a well performing fuse that is easy to manufacture. The electrical fuse device is molded of conductive loaded resin-based materials. The electrical or thermal characteristics can be altered or the visual characteristics can be altered by forming a metal layer over the conductive loaded resin-based material.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An electrical fuse device comprising:
   a fusible link comprising a conductive loaded, resin-based material comprising micron conductive fiber in a base resin host wherein said micron conductive fiber has a diameter of between 3 µm and 12 µm and a length of between 2 mm and 14 mm;
   a first conductive terminal connected to a first end of said fusible link; and
   a second conductive terminal connected to a second end of said fusible link wherein said first and second conductive terminals comprise said conductive loaded, resin-based material.

2. The device according to claim 1 wherein the percent by weight of said micron conductive fiber is between about 20% and about 50% of the total weight of said conductive loaded resin-based material.

3. The device according to claim 1 wherein said conductive loaded, resin-based material further comprises conductive powder.

4. The device according to claim 1 wherein said micron conductive fiber are metal.

5. The device according to claim 1 wherein said micron conductive fiber are non-conductive materials with metal plating.

6. The device according to claim 1 wherein said conductive terminals are metal plated.

7. The device according to claim 1 wherein said fusible link is metal plated.

8. The device according to claim 1 further comprising an insulating layer overlying said fusible link.

9. An electrical fuse device comprising:
a fusible link;
a first conductive terminal connected to a first end of said fusible link; and
a second conductive terminal connected to a second end of said fusible link wherein said fusible link and said conductive terminals comprise a conductive loaded, resin-based material comprising conductive materials in a base resin host.

10. The device according to claim 9 wherein said conductive materials are nickel plated carbon micron fiber, stainless steel micron fiber, copper micron fiber, silver micron fiber or combinations thereof.

11. The device according to claim 9 wherein said conductive materials comprise micron conductive fiber and conductive powder.

12. The device according to claim 11 wherein said conductive powder is nickel, copper, or silver.

13. The device according to claim 11 wherein said conductive powder is a non-conductive material with a metal plating of nickel, copper, silver, or alloys thereof.

14. The device according to claim 9 wherein said conductive terminals are metal plated.

15. The device according to claim 9 wherein said fusible link is metal plated.

16. The device according to claim 9 further comprising an insulating layer overlying said fusible link.

17. The device according to claim 16 wherein said insulating layer comprises a resin-based material.

18. An electrical fuse device comprising:
a fusible link;
a first conductive terminal connected to a first end of said fusible link; and
a second conductive terminal connected to a second end of said fusible link wherein said fusible link and said conductive terminals comprise a conductive loaded, resin-based material comprising micron conductive fiber in a base resin host wherein the percent by weight of said conductive fiber is between 20% and 50% of the total weight of said conductive loaded resin-based material.

19. The device according to claim 18 wherein said micron conductive fiber is stainless steel.

20. The device according to claim 19 further comprising conductive powder.

21. The device according to claim 19 wherein said micron conductive fiber has a diameter of between about 3 µm and about 12 µm and a length of between about 2mm and about 14 mm.

22. The device according to claim 19 wherein said conductive terminals are metal plated.

23. The device according to claim 19 further comprising an insulating layer overlying said fusible link.

* * * * *